United States Patent [19]

Jacobsen

[11] Patent Number: 4,802,551

[45] Date of Patent: Feb. 7, 1989

[54] LOUDSPEAKER UNIT

[75] Inventor: Preben Jacobsen, Glyngφre, Denmark

[73] Assignee: Jamo Hi-Fi A/S, Glyngφre, Denmark

[21] Appl. No.: 881,247

[22] Filed: Jul. 2, 1986

[30] Foreign Application Priority Data

Jul. 5, 1985 [DK] Denmark ............................ 3093/85

[51] Int. Cl.[4] ............................................... H05K 5/00

[52] U.S. Cl. .................................... 181/146; 181/148; 181/151; 181/199

[58] Field of Search ................ 181/151, 199, 146, 148

[56] References Cited

U.S. PATENT DOCUMENTS

| | | | |
|---|---|---|---|
| 3,652,360 | 3/1972 | Hartman et al. | 181/199 X |
| 4,592,444 | 6/1986 | Perrigo | 181/151 |
| 4,596,305 | 6/1986 | Jagborn | 181/151 |

FOREIGN PATENT DOCUMENTS

| | | |
|---|---|---|
| 1512745 | 8/1971 | Fed. Rep. of Germany . |
| 2321175 | 11/1973 | Fed. Rep. of Germany . |
| 2913256 | 10/1980 | Fed. Rep. of Germany . |
| DE 3303511 | 8/1984 | Fed. Rep. of Germany . |
| 426283 | 12/1982 | Sweden . |

*Primary Examiner*—Benjamin R. Fuller

*Attorney, Agent, or Firm*—Cushman, Darby & Cushman

[57] ABSTRACT

For years efforts have been made to construct acoustically completely dead loudspeaker cabinets. Interest has of course been taken in a neutral reproduction of the signals transmitted to the loudspeaker system, without the acoustic image being changed by cabinet resonances or other irrelevant sources of noise. According to the invention one or several of the cabinet walls are constituted by a hollow body (2), into the interior of which a foamed plastic material mixed with grains of comparatively high specific gravity is injected. These grains are sound and vibration absorbing, so that the walls are practically without resonances, and the weight is simultaneously reduced.

2 Claims, 2 Drawing Sheets

LOUDSPEAKER UNIT

BACKGROUND OF THE INVENTION

1. Field of the Invention

The present invention relates to a loudspeaker unit comprising a loudspeaker cabinet, in which one or several cabinet walls, including the front plate, are constituted by a hollow body, into the interior of which a foamed plastic material has been injected.

2. Description of the Related Art

German Offenlegungsschrift No. 2,913,256 discloses a loudspeaker cabinet, in which the walls consist of a polyester resin mixed with sand.

Furthermore, German Auslegeschrift No. 1,512,745 discloses a loudspeaker cabinet, in which the walls are constituted by hollow bodies, into which a foamed plastic material has been injected. However, this plastic material does not have a sufficient sound absorption at lower frequencies.

SUMMARY OF THE INVENTION

The foamed plastic material is according to the invention mixed with sand of a comparatively high specific gravity.

As a result the walls are quite without resonances without the weight thereby being increased.

Besides, the invention relates to a method of manufacturing a front plate for a loudspeaker cabinet from a hollow body, into the interior of which a foamed plastic material has been injected. The method is characterized in that the foamed plastic material before injection into the hollow body is mixed with grains of a comparatively high specific gravity. A particularly advantageous method is consequently obtained.

BRIEF DESCRIPTION OF THE DRAWINGS

The invention will be described in detail below with reference to the accompanying drawings, in which.

DESCRIPTION OF THE PREFERRED EMBODIMENTS

Figure 1:
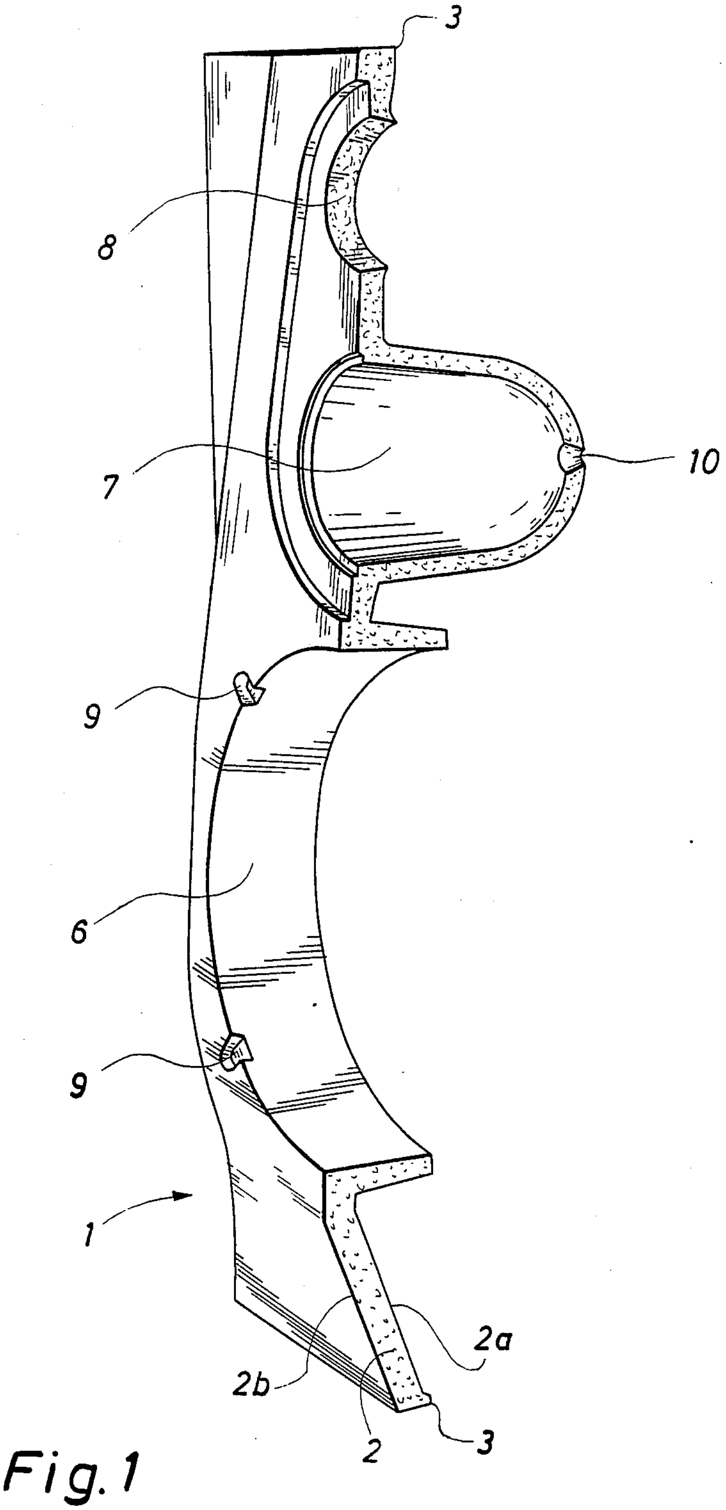
FIG. 1 is a sectional view through a front plate for a loudspeaker unit according to the invention.
Figure 2:
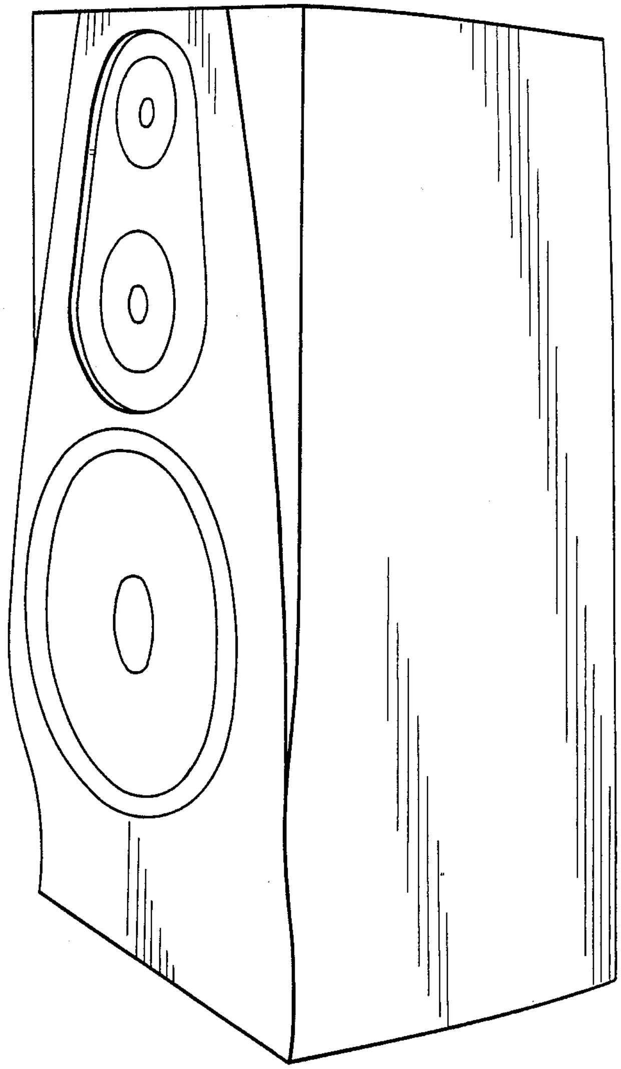
FIG. 2 illustrates the entire loudspeaker unit.

The front plate 2 illustrated in FIG. 1 for a loudspeaker unit is constituted by a hollow body 2, into the interior of which a foamed plastic material has been injected. Before injection the plastic material has been mixed with grains of a comparatively high specific gravity, preferably clean sand, of a grain size of about 1.5-2.0 mm. Polyurethane, polystyrene, carbamide or polyester foam may e.g. be used as the foamed plastic material. It is only of decisive importance that the foaming is performed with a certain strength after injection into the hollow body. The grains of comparatively high specific gravity are sound and vibration absorbing, so that the plate 1 is without resonances. The characteristics of the loudspeaker unit may furthermore be changed slightly by varying the grain size and optionally choosing grains of a material of a different specific gravity.

The hollow body 2 is preferably constituted by moulded parts *2a, 2b* joined after moulding e.g. along the edges 3.

In a preferred embodiment the front plate 1 is provided with three openings 6, 7, 8. A low-frequency speaker is located in the lower opening 6, a mid range speaker is located in the central opening 7, and a high-frequency speaker is located in the upper opening 8. The low-frequency speaker is fastened to the front plate 1 by means of vibration absorbing fastening means in the form of rubber blocks uniformly distributed along the periphery of the loudspeaker and inserted into recesses 9 in the mounting ring of the loudspeaker. The low-frequency speaker may alternatively be mounted on a separate tube, so to as to provide an annular slot between the tube and the front plate 3. Vibrations originating from the loudspeaker membrane are thus to a great extent prevented from propagating to the front plate 1, and through the front plate 1 to the rest of the cabinet.

The mid range speaker is located in a separate cavity, an opening 10 to the remaining part of the cabinet, however, being provided in view of the arrangement of leads.

The high-frequency speaker is located in the upper opening 8 in an architecturally advantageous manner.

The loudspeakers may optionally be electrically separated by crossover networks.

The front plate 1 is not necessarily of the same thickness all over. The advantage of the described manufacturing technique is a greater independence as to the thickness and construction of the front plate 1.

The rest of the cabinet can if occasion should arise be manufactured in the same way as the front plate 1.

According to the invention an acoustically dead cabinet is provided, which is considerably more light than previously known cabinets, and which can simultaneously be manufactured at a reasonable price. The injection can be performed by a worm device known per se, and as a result the loudspeaker cabinet is suitable for mass production.

The loudspeaker unit can be varied in many ways without thereby deviating from the idea of the invention.

I claim:

1. A front plate of a loudspeaker unit, including:

a hollow body having a plurality of joined inner, outer and edge walls;

said walls defining, on said front plate, at least one opening through which a loudspeaker, when mounted in the opening, may project sound;

said walls of said hollow body enclosing an interior cavity;

said interior cavity being filled with a filling of a mixture of a foamed plastic material and sand having a grain size in a range of about 1.5-2.0 mm and a specific gravity which is greater than that of said foamed plastic material, whereby said hollow body is substantially without acoustical resonance.

2. The first plate of claim 1, wherein:

said inner, outer and edge walls define an annular rearwardly-projecting flange extending circumferentially perimetrically of one said opening as a local thickening of said front plate; and said inner and outer walls further define in said front plate a forwardly-opening recess from which a further loudspeaker, when received in the recess, may project sound; and meas defining a hole through said front plate in said recess, whereby the further loudspeaker may be wired through said opening with the first-mentioned loudspeaker.

* * * * *